United States Patent [19]

Schmitt

[11] Patent Number: 4,798,739

[45] Date of Patent: Jan. 17, 1989

[54] PLASMA-ASSISTED METHOD FOR THIN FILM FABRICATION

[75] Inventor: Jacques Schmitt, La Ville Du Bois, France

[73] Assignee: Solems, Palaiseau, France

[21] Appl. No.: 921,072

[22] Filed: Oct. 21, 1986

[30] Foreign Application Priority Data

Oct. 25, 1985 [FR] France .................... 85 15910

[51] Int. Cl.⁴ .......................................... B05D 3/06
[52] U.S. Cl. ........................................ 427/38; 427/39
[58] Field of Search .............................. 427/37, 38, 39;
118/720, 723, 725, 733, 719; 204/192.1, 298

[56] References Cited

U.S. PATENT DOCUMENTS

| 4,123,989 | 11/1978 | Jewett | 118/733 X |
|---|---|---|---|
| 4,226,208 | 10/1980 | Nishida et al. | 118/719 X |
| 4,317,844 | 3/1982 | Carlson | 427/39 |
| 4,328,258 | 5/1982 | Coleman | 427/39 |
| 4,395,323 | 7/1983 | Denton et al. | 204/298 |
| 4,428,810 | 1/1984 | Webb et al. | 204/298 X |
| 4,461,783 | 7/1984 | Yamazaki | 118/723 X |
| 4,500,563 | 2/1985 | Ellenberger et al. | 118/723 X |
| 4,543,267 | 9/1985 | Yamazaki | 427/39 |
| 4,545,327 | 10/1985 | Campbell et al. | 118/119 |

FOREIGN PATENT DOCUMENTS

| 34706 | 9/1981 | European Pat. Off. |  |
|---|---|---|---|
| 0003976 | 1/1978 | Japan | 118/733 |
| 1064877 | 4/1986 | Japan | 118/723 |
| 2118212 | 3/1983 | United Kingdom |  |

OTHER PUBLICATIONS

Patent Abstracts of Japan, vol. 8, No. 30 (C-209), [1467], Feb. 8, 1984, JP A 58 193 362.
Patent Abstracts of Japan, vol. 8, No. 95 (E-242), [1532], May 2, 1984, JP A 59 14 633.
Patent Abstracts of Japan, vol. 8, No. 122 (C-227), [1559], Jun. 8, 1984, JP A 59 35 674.
Patent Abstracts of Japan, vol. 9, No. 52 (C-269), [1775], Mar. 6, 1985, JP A 59 193 265.
Patent Abstracts of Japan, vol. 7, No. 166 (E-138), [1311], Jul. 21, 1983, JP A 58 73 111.

*Primary Examiner*—John F. Niebling
*Assistant Examiner*—Nam X. Nguyen
*Attorney, Agent, or Firm*—Pollock, VandeSande & Priddy

[57] ABSTRACT

A device has a low-pressure tank placed inside an airtight chamber for plasma-depositing onto at least two substrata spaced apart in a substantial parallel relationship in the tank thin films. To effect the decomposition of the gas reagent inside the tank, at least one perforated polarized plasma generating electrode is interposed between the substrate. The airtight chamber has a pressure lower than that of the tank.

1 Claim, 1 Drawing Sheet

PLASMA-ASSISTED METHOD FOR THIN FILM FABRICATION

FIELD OF THE INVENTION

The present invention concerns a device and a process of utilizing of said device for forming thin films by means of a plasma-assisted deposit of a chemical vapor.

This type of device allows the deposit of a wide variety of materials in the form of thin films, by decomposition in a low-pressure tank of one or more gas reagents, diluted or not in one or more carrier gases. Decomposition is induced by electrical discharge into the gas.

BACKGROUND OF THE INVENTION

More specifically, such a device for forming thin films by means of a plasma-assisted deposit of chemical vapor includes a low-pressure tank enclosing at least one gas reagent, at least two substrata in the form support plates for the thin film, and at least one polarized electrode in the form of a plasma-generating plate, said electrode being placed between the substrate, which are placed essentially parallel and separated from one another by an intermediate space. Various studies have been done on this type of device. The technique proposes in particular a device having a low-pressure tank in which are placed a support plate, called a substratum, onto which will be deposited the thin film after decomposition of the gas reagents, and a full plate, polarized and situated opposite said substratum, connected to a radio-frequency source. The substratum and the tank are generally grounded. However, the effectiveness of this type of device, i.e., the amount of material actually deposited onto the substratum in relation to the amount of material utilized, and its energy yield, are relatively low and dependent on the geometry of the device.

In addition, the device must be designed so as to allow easy maintenance, since the electrodes and other walls of the device are regularly covered over by a growing thickness of deposit that should be regularly removed, either by plasma-cutting (etching) or by the action of an operator. In fact, in most of the known devices, the film formed by decomposition of the gas reagents is deposited not only on the substratum but also throughout the tank.

SUMMARY OF THE INVENTION

The invention is intended to resolve the aforementioned difficulties.

To this end, according to the invention, the plasma-generating electrode has a perforated structure.

In this way, the device is very compact and produces a very favorable ratio between the device's volume and the deposited surface. In addition, this configuration lends itself to a very good uniformity of deposit, and most of the material is effectively deposited onto the substrate, the supports of the thin film, rather than on the other walls of the device or on the electrode. Advantageously, the electrode or electrodes take the form of a fine, wide-mesh screen, or a perforated plate.

It may be thought that a fine, perforated structure would be quickly damaged, in particular because of the high electrical power generally applied, and would harm the proper operation of the device. This is not the case. On the contrary, an electrode with such a configuration makes it possible to appreciably improve the device's output without harming wave transmission in the gaseous reactive medium.

The invention also applies to a process for using the device in which a method for circulation gases by pumping makes it possible to considerably limit the problem of contamination. This contamination is due in particular to the residual-vacuum impurities and to deposits by diffusion in the chamber surrounding the tank.

Thus the process for using the invention, intended in particular for a device of the type just presented, is characterized by the tank holding the electrode and the substrata being placed inside an airtight chamber, after which a stronger vacuum is produced in the airtight chamber than in the tank.

The invention, its characteristics and advantages will be better understood with the aid of the following description, given in reference to the attached drawings, in which:

DETAILED DESCRIPTION OF THE INVENTION

Figure 1:
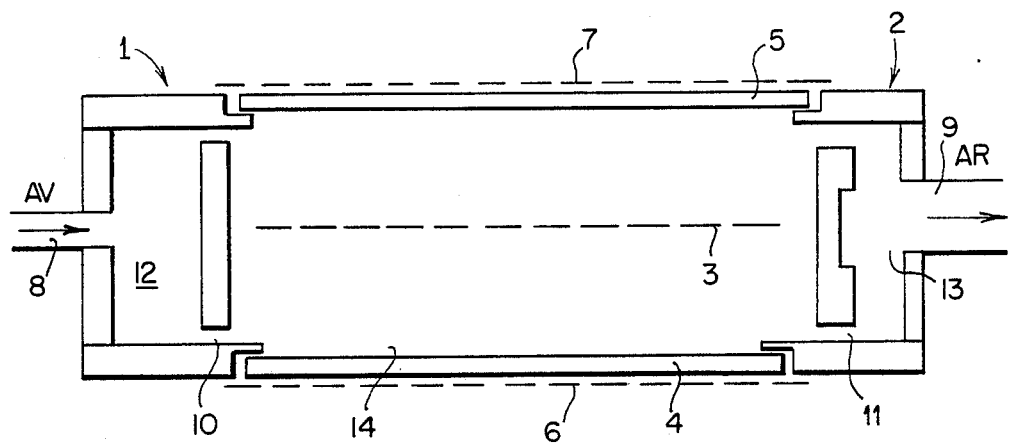
FIG. 1 shows the tank, diagrammatically and in cross-section, including in particular the substrata and one electrode.

With reference first to FIG. 1, the device, shown in its entirety 1, has a tank 2, into which the gas reagents flow, said gas reagents advantageously entering the tank through a feed pipe 8 through an opening located at the forward lengthwise end 12 of the tank.

The tank 2, which has the overall shape of a hollow parrallelepiped, is stopped towards its forward lengthwise end 12 by a first choke 10 and towards its rear lengthwise end 13 by a second choke 11. The gases present in the tank 2 are discharged at the rear end 13 through the pipe 9. In the figure, the "front" and "rear" sides of the tank have been designated by AV and AR, respectively, with reference to the circulation of gases in the device as diagrammed by the arrows.

In the example shown, two film support plates 4 and 5, the substrata, are housed in the side walls of the tank 2 and arranged essentially parallel to one another. The substrata 4 and 5 each has on its rear surface, i.e., the surface onto which the film generated by the gas reagents will not be deposited, a counter-electrode 6 and 7 respectively. In order to enable most of the material to be effectively deposited onto the substrata 4 and 5, the tank 2 has a space 14 between said substrata in which an electrode 3 is placed, essentially centrally. This electrode 3 has the overall form of an essentially plane plate having a perforated structure, i.e., in which passages are made for the circulation of the gaseous reactive medium. An electrode in the form of a screen would be quite suitable.

The counter-electrodes 6 and 7 could also take the form of a screen.

Figure 6:
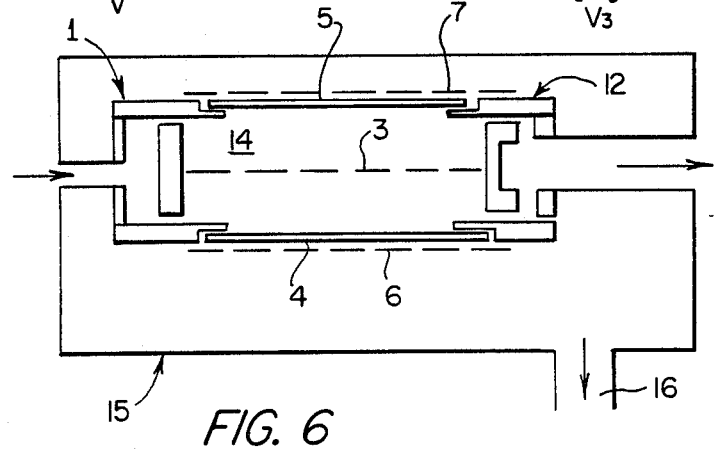
FIG. 6 shows the tank in FIG. 1 placed inside the airtight chamber.

Referring to FIG. 6, it is seen that the tank 2 is placed inside an airtight chamber 15, the volume of which is greater than that of the tank 2 and in which the pressure is lower than that in said tank. The low-pressure gas in the chamber 15 is discharged through the pipe in the direction indicated by the arrow.

Figure 2:
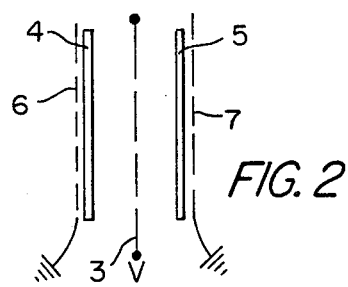
FIG. 2 shows a diagram of a device having two counter-electrodes, two substrata, and a central electrode.

According to FIG. 2, which is a diagrammatic representation of the principle at work in FIG. 1, the substrata are grounded through the counter-electrodes 6,7; and the central electrode 3 receives the plasma-generating electrical power. The applied voltage V may be direct, alternating, or even pulsating-alternating. The distance between the substrata may vary according to use, but the system retains its primary interest only when the spacing between the substrata is less than or close to the longitudinal and transversal dimensions of the device. In addition, the greater the "transparency" or porosity of the electrode's reactive medium, i.e., the larger the spaces made in its structure, the more the yield relative to the deposit of material increases. It should be noted that this transparency of the electrode may, however, vary according to the deposit sought and the environment selected. The extreme cases go from a full plate (which is not generally used according to the invention) to several wires stretched in the form of a screen, or grating, on a light frame.

If the plasma-generating discharge is fed by a DC or possibly AC generator, either the substrata 4 and 5 must be conducting and act as second electrode, or; if the substrata are insulating or if it is desired to avoid bombarding the substratum with accelerated particles, three electrodes 3, 23 and 33 in the form of a screen are advantageously used.

Figure 3:
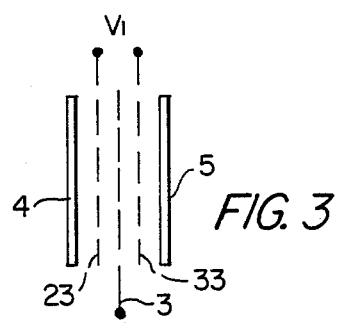
FIG. 3 shows diagrammatically a device having two substrata and three electrodes.

The central electrode 3 is then polarized in relation to the other two electrodes 23 and 33, between which a voltage $V_1$ is established, as illustrated in FIG. 3.

Figure 4:
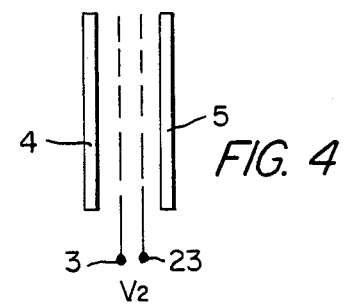
FIG. 4 shows diagrammatically a device having two substrata and two electrodes.

Should the polarization be achieved in radio-frequency, with A.C. voltage, two electrodes designated 3 and 23 may be used, between which a voltage $V_2$ will be established as illustrated in FIG. 4.

It should be noted that in the various cases in which the discharge is fed with A.C. voltage, the other electrode may be formed by the substrata 4 and 5, or, if they are insulated with plates or screens, by the counter-electrodes 6 and 7, placed directly over the rear surface of the substrata.

The various types of operation recommended above tend to limit the scale of the ion bombardment, which in many cases is unfavorable, but there are materials (amorphous carbon for optics, synchronization layer, etc.) for which ion bombardment is desirable. In such a case, according to the invention it is only necessary to use electrode plates having a greater developed surface, such as a honeycomb structure.

Figure 5:
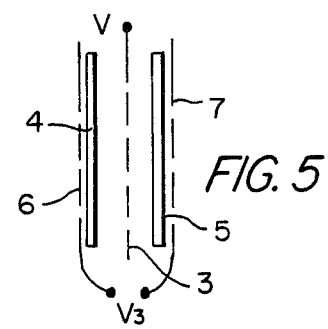
FIG. 5 shows diagrammatically a device having two counter-electrodes, two substrata, and a central electrode.

If the substrata and the film deposits are conducting, in order to achieve such a bombardment it is possible to polarize them in relation to the other electrode or electrodes. Otherwise, the two counter-electrodes (FIG. 5) placed behind the substrata may be connected skew-symmetrically to the terminals of a radio-frequency power source. A voltage $V_3$ is thus generated, feeding the plasma-generating discharge onto the electrode(s), in particular by means of an A.C. generator.

According to the invention, a wide variety of materials can be deposited in the form of a thin film by the decomposition in a low-pressure tank of one or more gas reagents, diluted or not in one or more carrier gases. The semi-conductors deposited may be doped by adding a carrier for the doping element in the gas mix. The properties of the material generally are highly dependent on the chemical purity of the reactive medium and the ion bombardment (flux, energy) to which the film is subjected during its growth.

Here are some examples of materials and generating gases:

|  | Gases |
| --- | --- |
| Semi-conductors | |
| hydrogenated amorphous silicium | $SiH_4$, $Si_2H_6$ |
| As Ga | $Ga(CH_3)_3$, $AsH_3$ |
| Miscellaneous alloys | $CH_4$, $SiH_4$, $GeH_4$, $SiF_4$ |
| Insulators | |
| Silica | $SiH_4$, $O_2$, $N_2O$ |
| Silicium nitride | $SiH_4$, $N_2$, $NH_3$ |
| Polymers | Monomer gases |
| Conductors | |
| Metals | Organometallics |

With reference to FIGS. 1 and 6, it may be noted that the gas reagents are injected into the tank 2 and encounter the first choke 10, also called a distributor, which allows a homogeneous distribution of the gases inside the tank. After remaining in the presence of the deposit plasma, the gases discharged through the pipe 9 pass into the second choke 11 in order to adjust their pressure. Evacuation of the gases is generally achieved by pumping.

It will also be noted that the very-low-pressure chamber in which the tank 2 is housed considerably limits problems of contamination of the material deposited on the substrata by "parasitic" impurities.

Gases escaping from the tank towards the airtight chamber, as well as from the degassing of the chamber, the outside walls of the tank, the heating systems and other mechanisms present in the chamber, are generally evacuated by a vacuum pump, of a size adequate to maintain the residual pressure in the chamber at a level well below that in the tank.

FIG. 6 shows an airtight chamber adapted to the geometry of the tank.

A number of variations may be made in the mode of realization illustrated

Thus, one or more electrodes may be provided in the form of plane perforated plates, the dimensions of their passages being adapted according to the yield and deposit sought.

Furthermore, it will be noted that in the mode of operation in FIG. 2 only one electrode (3) has been shown. However, several electrodes may be provided, as shown in FIG. 3 or 4. In particular, in reference to FIG. 4, two electrodes (3,23) of opposite polarity may be provided, subjected to a plasma-generating electrical discharge, placed between two substrata (4, 5) and grounded.

We claim:

1. Process of forming thin films by means of a plasma assisted chemical deposit of the type having a non-airtight tank in which is enclosed at least one reagent gas, at least one substratum in the form of a support plate for the thin films, and at least one polarized plasma-generating electrode, the process comprising the steps of:

placing the tank inside an airtight chamber; and maintaining lower pressure in the airtight chamber than in the tank wherein the reagent gas circulates.

* * * * *

UNITED STATES PATENT AND TRADEMARK OFFICE
CERTIFICATE OF CORRECTION

PATENT NO. : 4,798,739

DATED : January 17, 1989

INVENTOR(S) : Jacques Schmitt

It is certified that error appears in the above-identified patent and that said Letters Patent is hereby corrected as shown below:

In the Abstract, line 7, change "substrate" to --substrata--.

Column 1, line 7, after "utilizing" delete "of".

Column 1, line 23, change "substrate" to --substrata--.

Column 1, line 59, change "substrate" to --substrata--.

Column 2, line 4, change "circulation" to --circulating--.

Column 2, line 44, change "parrallelepiped" to --parallelepiped--.

Column 4, line 45, after "illustrated" insert --and described.--.

Signed and Sealed this

Thirtieth Day of May, 1989

*Attest:*

DONALD J. QUIGG

*Attesting Officer*  *Commissioner of Patents and Trademarks*